United States Patent
Herbsommer et al.

(10) Patent No.: US 9,490,518 B1
(45) Date of Patent: Nov. 8, 2016

(54) SYSTEM FOR LAUNCHING A SIGNAL INTO A DIELECTRIC WAVEGUIDE

(71) Applicant: Texas Instruments Incorporated, Dallas, TX (US)

(72) Inventors: Juan Alejandro Herbsommer, Allen, TX (US); Bradley Allen Kramer, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/867,662

(22) Filed: Sep. 28, 2015

(51) Int. Cl.
| | |
|---|---|
| H01P 3/16 | (2006.01) |
| H01Q 1/50 | (2006.01) |
| H01P 11/00 | (2006.01) |
| H01Q 19/18 | (2006.01) |
| H01Q 19/10 | (2006.01) |
| H01Q 15/14 | (2006.01) |
| H04B 1/04 | (2006.01) |

(52) U.S. Cl.
CPC ............... *H01P 3/16* (2013.01); *H01Q 15/14* (2013.01); *H01Q 19/10* (2013.01); *H04B 1/04* (2013.01)

(58) Field of Classification Search
CPC ...... H01Q 1/50; H01Q 19/108; H01Q 19/10; H01Q 19/18; H04B 1/40; H01P 3/16; H01P 11/001; H01P 5/00; H01P 3/165; H01P 3/121; H01P 5/107; H01P 11/002; H01P 5/184; H01P 5/087; G02B 6/4416; Y10T 29/49016; Y10T 29/49826; Y10T 19/10; Y10T 19/18
See application file for complete search history.

(56) References Cited

U.S. PATENT DOCUMENTS

| | | | | |
|---|---|---|---|---|
| 6,384,694 | B1* | 5/2002 | Tanizaki | H01P 3/165 333/21 R |
| 9,166,269 | B2* | 10/2015 | Haroun | H01P 3/16 |
| 9,300,024 | B2* | 3/2016 | Schuppener | H01P 3/16 |
| 9,373,878 | B2* | 6/2016 | Schuppener | H01P 3/16 |
| 2004/0145858 | A1* | 7/2004 | Sakurada | H05K 3/4647 361/600 |
| 2014/0240187 | A1 | 8/2014 | Herbsommer et al. | |
| 2014/0287701 | A1 | 9/2014 | Herbsommer et al. | |
| 2015/0295307 | A1* | 10/2015 | Cook | H01P 3/122 343/812 |
| 2016/0006101 | A1* | 1/2016 | Payne | H01P 3/16 385/101 |

OTHER PUBLICATIONS

Benjamin S. Cook and Juan Alejandro Herbsommer, "Metallic Waveguide with Dielectric Core", U.S. Appl. No. 14/498,837, filed Sep. 26, 2014, pp. 1-27.

(Continued)

*Primary Examiner* — Pablo Tran
(74) *Attorney, Agent, or Firm* — John R. Pessetto; Charles A. Brill; Frank D. Cimino

(57) ABSTRACT

A system is provided for transmitting sub-terahertz electromagnetic radio frequency (RF) signals using a dielectric waveguide (DWG) having a dielectric core member surrounded by dielectric cladding. An RF transmitter is coupled to an antenna located on a first substrate, in which the antenna is adjacent an edge of the substrate. The first substrate is mounted on a second substrate. A conductive reflector plate is formed on the top surface of the second substrate. An end of the DWG is mounted on the second substrate over the reflector plate such that an exposed face of the core member at the end of the DWG is adjacent the antenna. The core member at the end of DWG forms an angle of inclination with the second substrate in which the angle is in a range of approximately 10-30 degrees.

14 Claims, 12 Drawing Sheets

(56) References Cited

OTHER PUBLICATIONS

Dr. J.S. Mandeep and Mr. Nicholas, "Design an X-Band Vivaldi Antenna", mircrowaves&rf, Jul. 15, 2008, pp. 1-6, available at http://mwrf.com/markets/design-x-band-vivaldi-antenna.

Dr. J.S. Mandeep and Mr. Nicholas, "Design an X-Band Vivaldi Antenna, Part 2", microwaves&rf, Aug. 13, 2008, pp. 1-6, available at http://wrf.com/test-and-measurement/design-x-band-vivaldi-antenna-part-2.

"Flip Chip Ball Grid Array Package Reference Guide", Literature No. SPRU811A, Texas Instruments, May 2006, pp. 1-72.

* cited by examiner

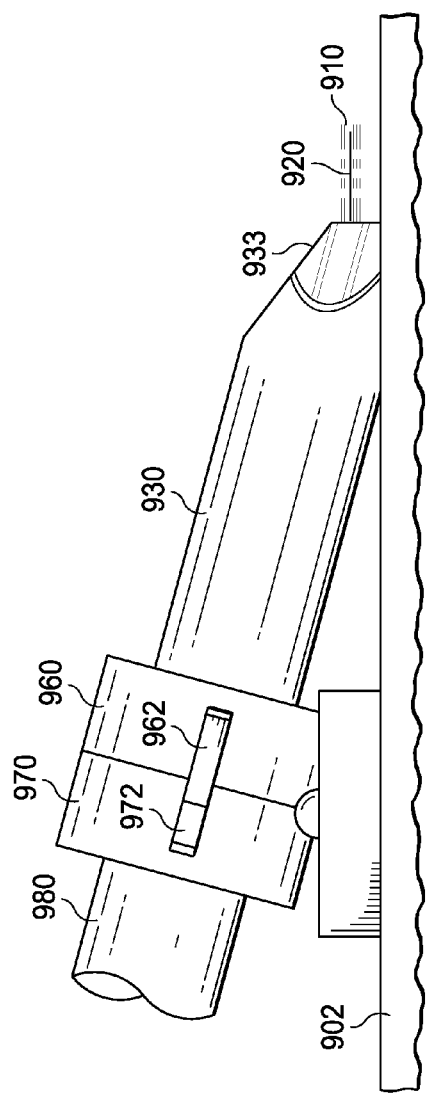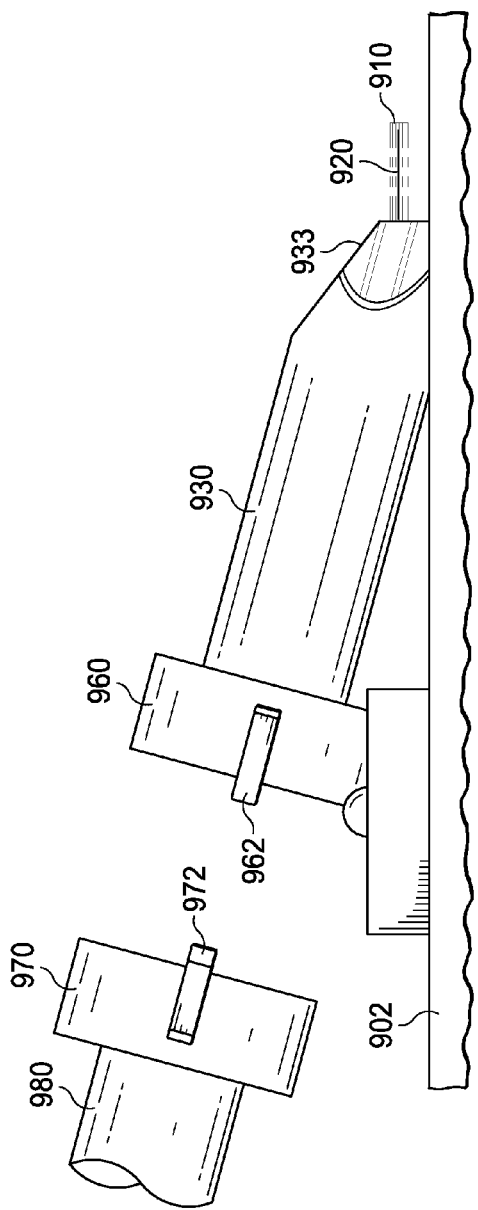

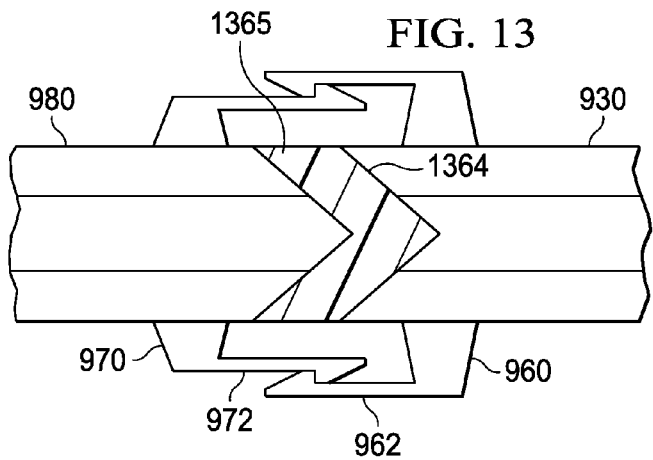
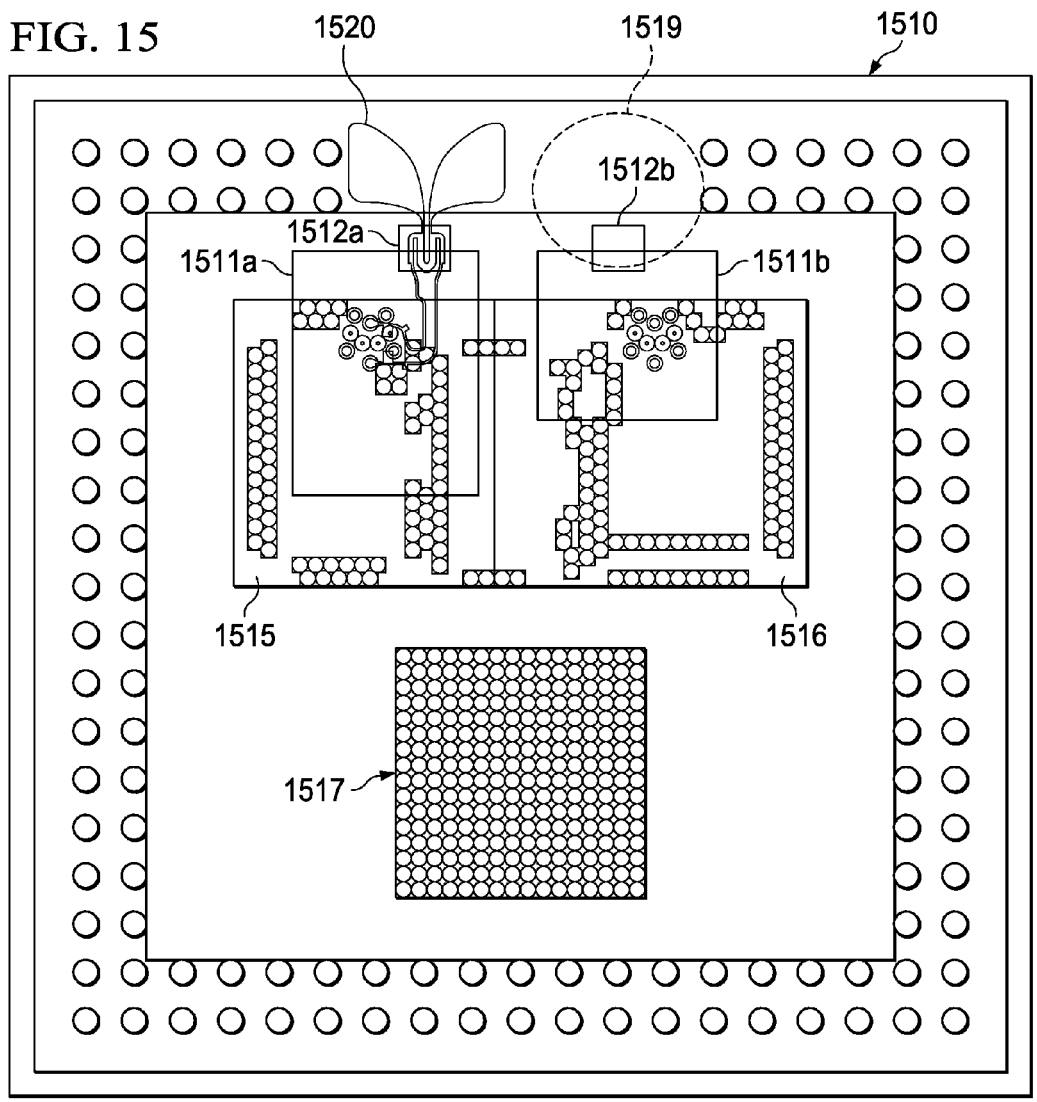

SYSTEM FOR LAUNCHING A SIGNAL INTO A DIELECTRIC WAVEGUIDE

FIELD OF THE INVENTION

This invention generally relates to wave guides for high frequency signals, and in particular to structures for launching a signal into a dielectric waveguide.

BACKGROUND OF THE INVENTION

In electromagnetic and communications engineering, the term waveguide may refer to any linear structure that conveys electromagnetic waves between its endpoints. The original and most common meaning is a hollow metal pipe used to carry radio waves. This type of waveguide is used as a transmission line for such purposes as connecting microwave transmitters and receivers to their antennas, in equipment such as microwave ovens, radar sets, satellite communications, and microwave radio links.

A dielectric waveguide employs a solid dielectric core rather than a hollow pipe. A dielectric is an electrical insulator that can be polarized by an applied electric field. When a dielectric is placed in an electric field, electric charges do not flow through the material as they do in a conductor, but only slightly shift from their average equilibrium positions causing dielectric polarization. Because of dielectric polarization, positive charges are displaced toward the field and negative charges shift in the opposite direction. This creates an internal electric field which reduces the overall field within the dielectric itself. If a dielectric is composed of weakly bonded molecules, those molecules not only become polarized, but also reorient so that their symmetry axis aligns to the field. While the term "insulator" implies low electrical conduction, "dielectric" is typically used to describe materials with a high polarizability; which is expressed by a number called the relative permittivity ($\in k$). The term insulator is generally used to indicate electrical obstruction while the term dielectric is used to indicate the energy storing capacity of the material by means of polarization.

Permittivity is a material property that expresses a measure of the energy storage per unit meter of a material due to electric polarization $(J/V^2)/(m)$. Relative permittivity is the factor by which the electric field between the charges is decreased or increased relative to vacuum. Permittivity is typically represented by the Greek letter c. Relative permittivity is also commonly known as dielectric constant.

Permeability is the measure of the ability of a material to support the formation of a magnetic field within itself in response to an applied magnetic field. Magnetic permeability is typically represented by the Greek letter μ.

The electromagnetic waves in a metal-pipe waveguide may be imagined as travelling down the guide in a zig-zag path, being repeatedly reflected between opposite walls of the guide. For the particular case of a rectangular waveguide, it is possible to base an exact analysis on this view. Propagation in a dielectric waveguide may be viewed in the same way, with the waves confined to the dielectric by total internal reflection at its surface.

BRIEF DESCRIPTION OF THE DRAWINGS

Particular embodiments in accordance with the invention will now be described, by way of example only, and with reference to the accompanying drawings:

FIGS. 9-13 are illustrations of a DWG socket and plug;

FIG. 15 is an example substrate with a Vivaldi antenna;

Figure 1:
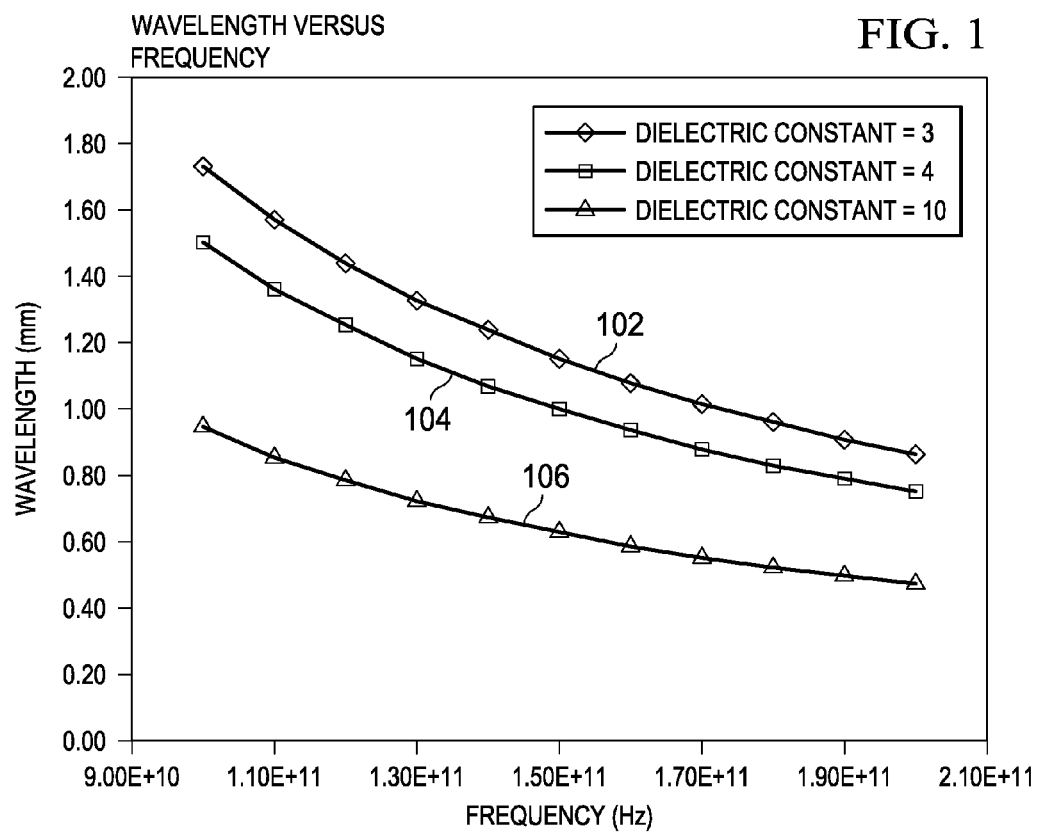
FIG. 1 is a plot of wavelength versus frequency through materials of various dielectric constants.

Other features of the present embodiments will be apparent from the accompanying drawings and from the detailed description that follows.

DETAILED DESCRIPTION OF EMBODIMENTS OF THE INVENTION

Specific embodiments of the invention will now be described in detail with reference to the accompanying figures. Like elements in the various figures are denoted by like reference numerals for consistency. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

A dielectric waveguide (DWG) may be used as a medium to communicate chip to chip in a system or system to system, for example. Interfacing a DWG cable directly to a transmitting and/or receiving module may provide a low cost interconnect solution. Embodiments of this disclosure provide a way to interface a DWG directly to a system module, as will be described in more detail below.

As frequencies in electronic components and systems increase, the wavelength decreases in a corresponding manner. For example, many computer processors now operate in the gigahertz realm. As operating frequencies increase into the sub-terahertz realm, the wavelengths become short enough that signal lines that exceed a short distance may act as an antenna and signal radiation may occur. FIG. 1 is a plot of wavelength versus frequency through materials of various dielectric constants. As illustrated by plot 102 which represents a material with a low dielectric constant of 3, such as a typical printed circuit board, a 100 GHz signal will have a wavelength of approximately 1.7 mm. Thus, a signal line that is only 1.7 mm in length may act as a full wave antenna and radiate a significant percentage of the signal energy. In fact, even lines of λ/10 are good radiators, therefore a line as short as 170 um in a printed circuit board may act as a good antenna at this frequency. Wavelength typically decreases in materials with higher dielectric constants, as illustrated by plot 104 for a dielectric constant of 4 and plot 106 for a dielectric constant of 10, for example.

Waves in open space propagate in all directions, as spherical waves. In this way they lose their power proportionally to the square of the distance; that is, at a distance R from the source, the power is the source power divided by R^2. A low-loss wave guide may be used to transport high frequency signals over relatively long distances. The waveguide confines the wave to propagation in one dimension, so that under ideal conditions the wave loses no power while propagating. Electromagnetic wave propagation along the axis of the waveguide is described by the wave equation, which is derived from Maxwell's equations, and where the wavelength depends upon the structure of the waveguide, and the material within it (air, plastic, vacuum, etc.), as well as on the frequency of the wave. Commonly-used waveguides are only of a few categories. The most common kind of waveguide is one that has a rectangular cross-section, one that is usually not square. It is common for the long side of this cross-section to be twice as long as its short side. These are useful for carrying electromagnetic waves that are horizontally or vertically polarized.

A waveguide configuration may have a core member made from dielectric material with a high dielectric constant and be surrounded with a cladding made from dielectric material with a lower dielectric constant. While theoretically, air could be used in place of the cladding, since air has a dielectric constant of approximately 1.0, any contact by humans, or other objects may introduce serious discontinuities that may result in signal loss or corruption. Therefore, typically free air does not provide a suitable cladding.

For the exceedingly small wavelengths encountered for sub-THz radio frequency (RF) signals, dielectric waveguides perform well and are much less expensive to fabricate than hollow metal waveguides. Furthermore, a metallic waveguide has a frequency cutoff determined by the cross-sectional size of the waveguide. Below the cutoff frequency there is no propagation of the electromagnetic field. Dielectric waveguides may have a wider range of operation without a fixed cutoff point. However, a purely dielectric waveguide may be subject to interference caused by touching by fingers or hands, or by other conductive objects. Metallic waveguides confine all fields and therefore do not suffer from EMI (electromagnetic interference) and crosstalk issues; therefore, a dielectric waveguide with a metallic cladding may provide significant isolation from external sources of interference.

US Patent Application publication number US 2014-0287701 A1 filed Apr. 1, 2013, entitled "Integrated Circuit with Dipole Antenna Interface for Dielectric Waveguide" is incorporated by reference herein. Various configurations of dielectric waveguides (DWG) and interconnect schemes are described therein. Various antenna configurations for launching and receiving radio frequency signals to/from a DWG are also described therein.

US Patent Application publication number US 2014-0240187 A1 filed Apr. 1, 2013, entitled "Dielectric Waveguide with Non-planar Interface Surface" is incorporated by reference herein. Various configurations of DWG sockets and interfaces are described therein.

Fabrication of DWGs using 3D printing is described in more detail in U.S. patent application Ser. No. 14/498,837, "Metallic Waveguide with Dielectric Core," Benjamin S. Cook et. al., which is incorporated by reference herein.

Figure 2:
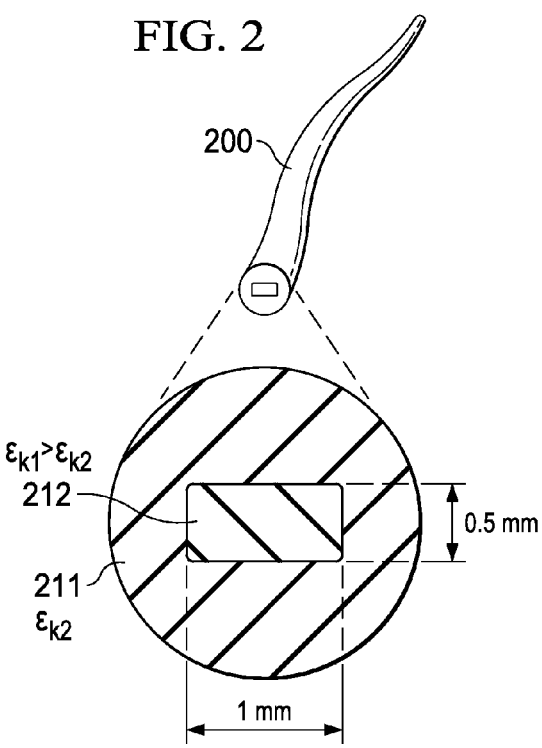
FIG. 2 is an illustration of an example dielectric waveguide.

FIG. 2 illustrates a DWG 200 that is configured as a thin ribbon of a core dielectric material surrounding by a dielectric cladding material. The core dielectric material has a dielectric constant value ∈1, while the cladding has a dielectric constant value of ∈2, where ∈1 is greater than ∈2. In this example, a thin rectangular ribbon of the core material 212 is surrounded by the cladding material 211. For sub-terahertz signals, such as in the range of 130-150 gigahertz, a core dimension of approximately 0.5 mm×1.0 mm works well.

Flexible DWG cables may be fabricated using standard manufacturing materials and fabrication techniques. These cable geometries may be built using techniques such as: drawing, extrusion, or fusing processes, which are all common-place to the manufacture of plastics.

Figure 3:
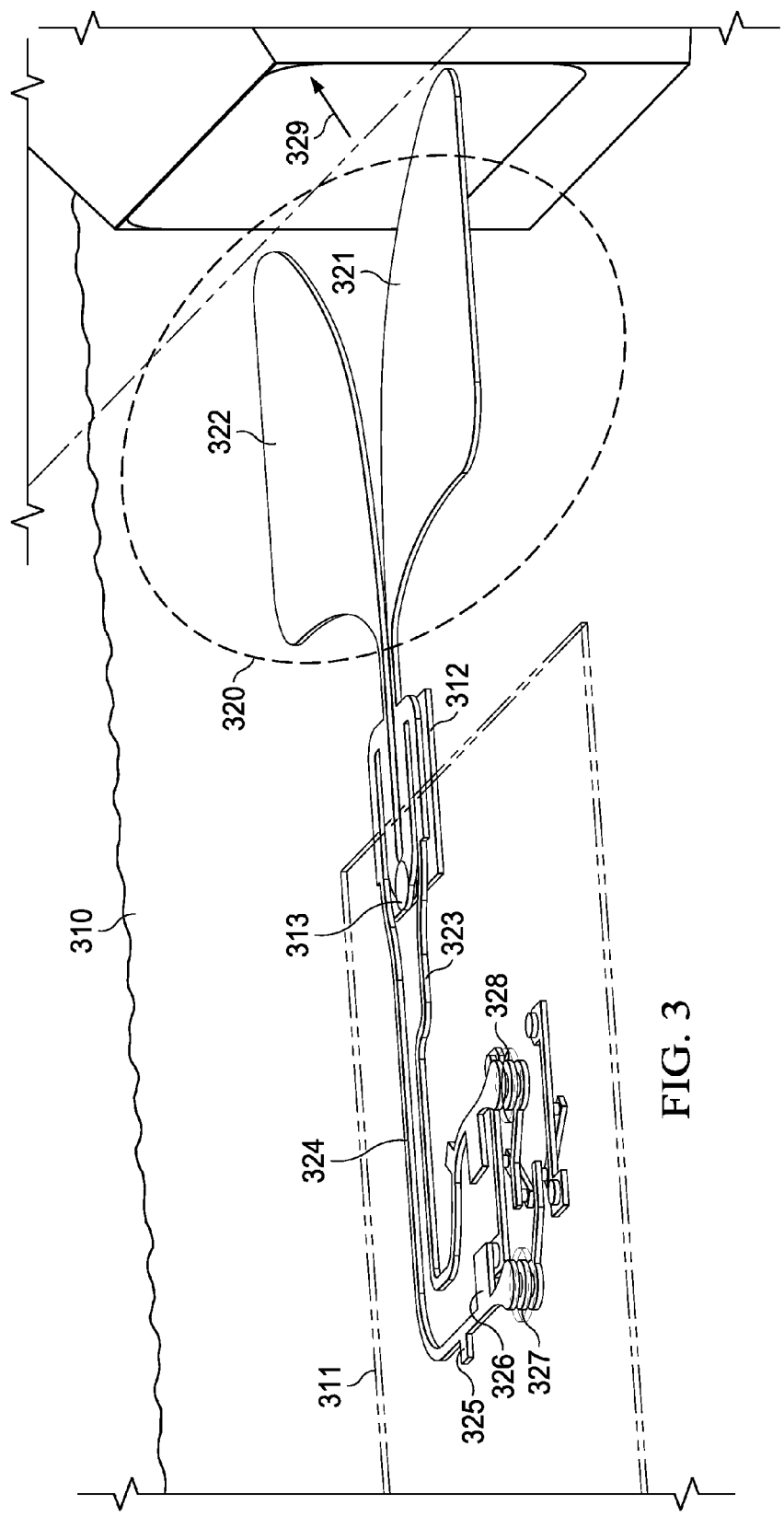
FIG. 3 is a three dimensional view of a Vivaldi antenna on a substrate.

FIG. 3 is a three dimensional view of portion of a system with a Vivaldi antenna 320 on a substrate 310. This substrate may range from an integrated circuit (IC) die, a substrate in a multi-chip package, a printed circuit board (PCB) on which several ICs are mounted, etc., for example. Substrate 310 may be any commonly used or later developed material used for electronic systems and packages, such as: silicon, ceramic, Plexiglas, fiberglass, plastic, etc., for example. The substrate may be as simple as paper, for example.

The Vivaldi antenna is essentially a slot antenna with two conductive lobes 321, 322. The general design of Vivaldi antennas is well known; e.g., see "Design an X-Band Vivaldi Antenna", Dr. J. S. Mandeep et al, 2008, which is incorporated by reference herein, and therefore will not be described in detail herein. Vivaldi antennas are highly directional and tend to radiate away from the antenna along the axis of the slot, as indicated at 329. This trait makes them useful for launching a sub-terahertz signal into a DWG, and similarly for receiving a sub-terahertz signal from a DWG, as will be described in more detail below.

Referring still to FIG. 3, a differential feed line 323, 324 may be used to couple lobes 321, 322 of the Vivaldi antenna to a transmitter or receiver (not shown) that may be mounted on substrate 310. Care must be taken to keep the length of each signal line 323, 324 the same so that the sub-terahertz signals arrive on each lobe at the same time. Otherwise, the radiated signal may be distorted or attenuated.

Routing of the signal lines from the transmitter/receiver to the antenna lobes 321, 322 may require via holes, such as 327, 328, through one or more layers of substrate 310. Tuning stubs, such as 325, 326, may be added to adjust the impedance of signal lines 323, 324 to match the impedance of the vias, for example. In this manner, signal discontinuities may be minimized.

Conductive plate 311 is included in this embodiment to in order to shield circuitry located on substrate 310 from RF emissions from antenna 320. Conductive plate 312 acts as a ground reference for antenna 320. Feed through via 313 couples the base of antenna 320 to ground plate 312.

Figure 4:
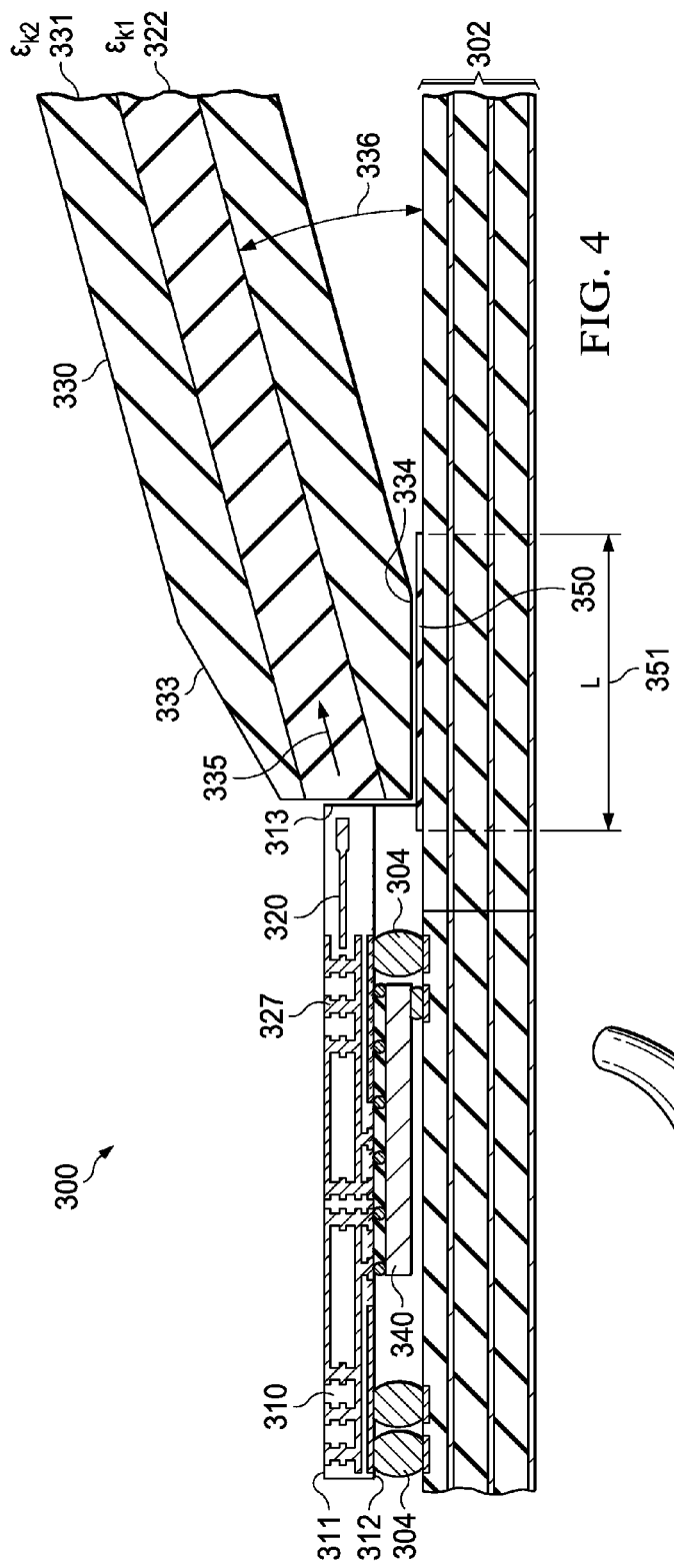
FIG. 4 is a side view of a dielectric waveguide (DWG) interfaced to a package containing an antenna.

FIG. 4 is a side view of a system 300 that may include DWG 330 interfaced to substrate 310 containing antenna 320. DWG has a dielectric core 332 and a dielectric cladding 331, as described above with reference to DWG 200. DWG cladding 331 is formed with a low dielectric constant (∈k2) material and core 332 is formed with a higher dielectric constant (∈k1) material.

Substrate 310 has a "top" surface 311 and a "bottom" surface 312. The terms "top" and "bottom" are used merely for reference convenience and are not meant to imply any particular orientation. Antenna 320 is positioned so that it is close to an interface edge 313 of substrate 310 in order to better couple radiation into DWG 330.

Multilayer substrate 310 may contain several conductive layers separated by insulating layers. The various conductive layers may be patterned into interconnect patterns and interconnected by vias, as is well known. Vias are also brought to the surface of substrate 310 and provide connection pads for an integrated circuit (IC). Multilayer substrate 302 may contain several conductive layers separated by insulating layers. The various conductive layers may be patterned into interconnect patterns and interconnected by vias, as is well known. Vias are also brought to the surface of the substrate 310 and provide connection pads for IC carrier substrate 310. Solder balls 304 provide an electrical connection between the pins on carrier 310 and the via pads on substrate 302, as is well known. IC 340 is mounted on carrier substrate 310 and contains circuitry that generates a high frequency signal using known techniques.

In this example, antenna 320 is implemented on a conductive layer that is an internal layer of multilayer substrate 310. In another embodiment, antenna 320 may be formed on a different layer, such as: on the top surface 311 of substrate 310, or on the bottom surface 312 of substrate 310, for example.

An integrated circuit (IC) 340 that may include a transmitter circuit that produces a high frequency sub-terahertz signal, or a high frequency receiver circuit, or both, may be mounted on substrate 310. An output port of the transmitter may be coupled to antenna 320 via balanced signal lines and vias, such as indicated at 327, and described in more detail with regard to FIG. 3. Similarly, if IC 340 contains a receiver, an input port of the receiver may be coupled to antenna 320 via balanced signal lines and vias, such as indicated at 327, and described in more detail with regard to FIG. 3.

In this example, IC 340 is mounted on the bottom surface 312 of carrier substrate 310 in a "die down" configuration. In another embodiment, IC 340 may be mounted on top surface 311, in a "flip-chip" configuration, for example.

Substrate 302 may be any commonly used or later developed material used for electronic systems and packages, such as: silicon, ceramic, Plexiglas, fiberglass, plastic, etc., for example. Substrate 302 may be as simple as paper, for example. Substrate 302 and/or substrate 310 may be printed circuit boards (PCB) for example.

DWG 330 is mounted on substrate 302 such that an exposed face of core 332 is approximately centered around the center line of antenna 320 and adjacent to interface edge 313 of substrate 310. A conductive reflector plate 350 may be placed under the end of DWG 330 in order to focus energy that is radiated from antenna 320 into DWG 330. Reflector plate 350 causes the radiated signal to have an upward vector as indicated at 335. In order to better capture this upward radiated signal, DWG 330 may be mounted on substrate 302 at an angle 336 that approximately matches vector 335, for example.

The angle of inclination may vary depending on the type of antenna, the location and size of the conductive reflector plate, the signal frequency, etc. The DWG should be inclined to align with the resulting radiation lobe of the transmitted signal. In this example, angle 336 is approximately 15 degrees. For signals in the range of 110-150 GHz and using typical IC carrier technology, an angle in the range of 10-30 degrees may be expected, for example.

Figure 5:
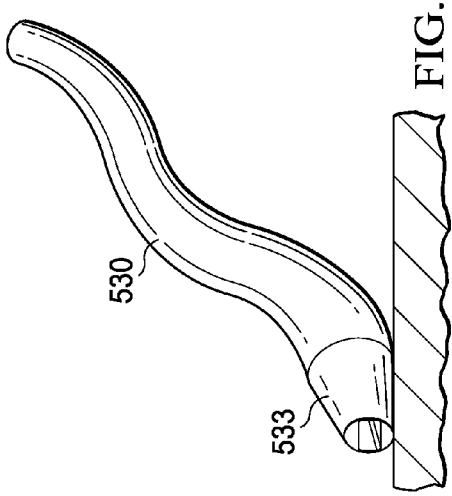
FIG. 5 is an illustration of another embodiment of a tapered DWG.

The end of DWG 330 may be tapered as indicated at 333, 334 in order to allow the DWG core element 332 to be centered on antenna 320. Tapering the end of DWG may also improve impedance matching between antenna 320 and DWG 330. In this example, four facets are formed on the end of DWG 330; top 333, bottom 334, and both sides (not shown). FIG. 5 illustrates another embodiment of a DWG 520 in which the end region is tapered in a circular manner, similar to a sharpened pencil. Other tapered configurations may be applied to the end of a DWG in order to improve coupling and impedance matching.

Polishing the tapered portions of DWG 330, 530 may improve coupling and impedance matching.

Figure 6:
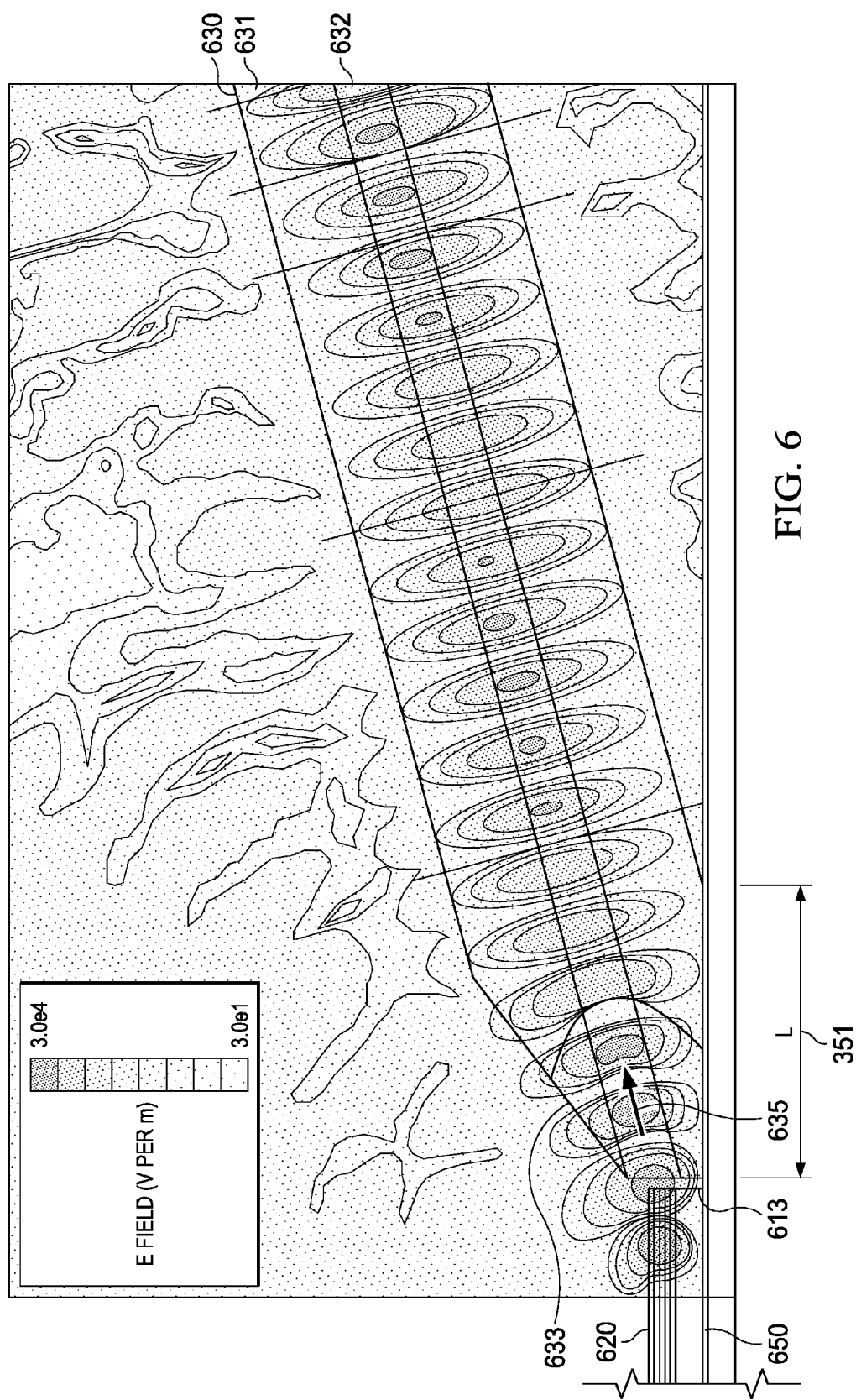
FIGS. 6-8 are simulation plots of a signal launched into the DWG of FIG. 4.
Figure 7:
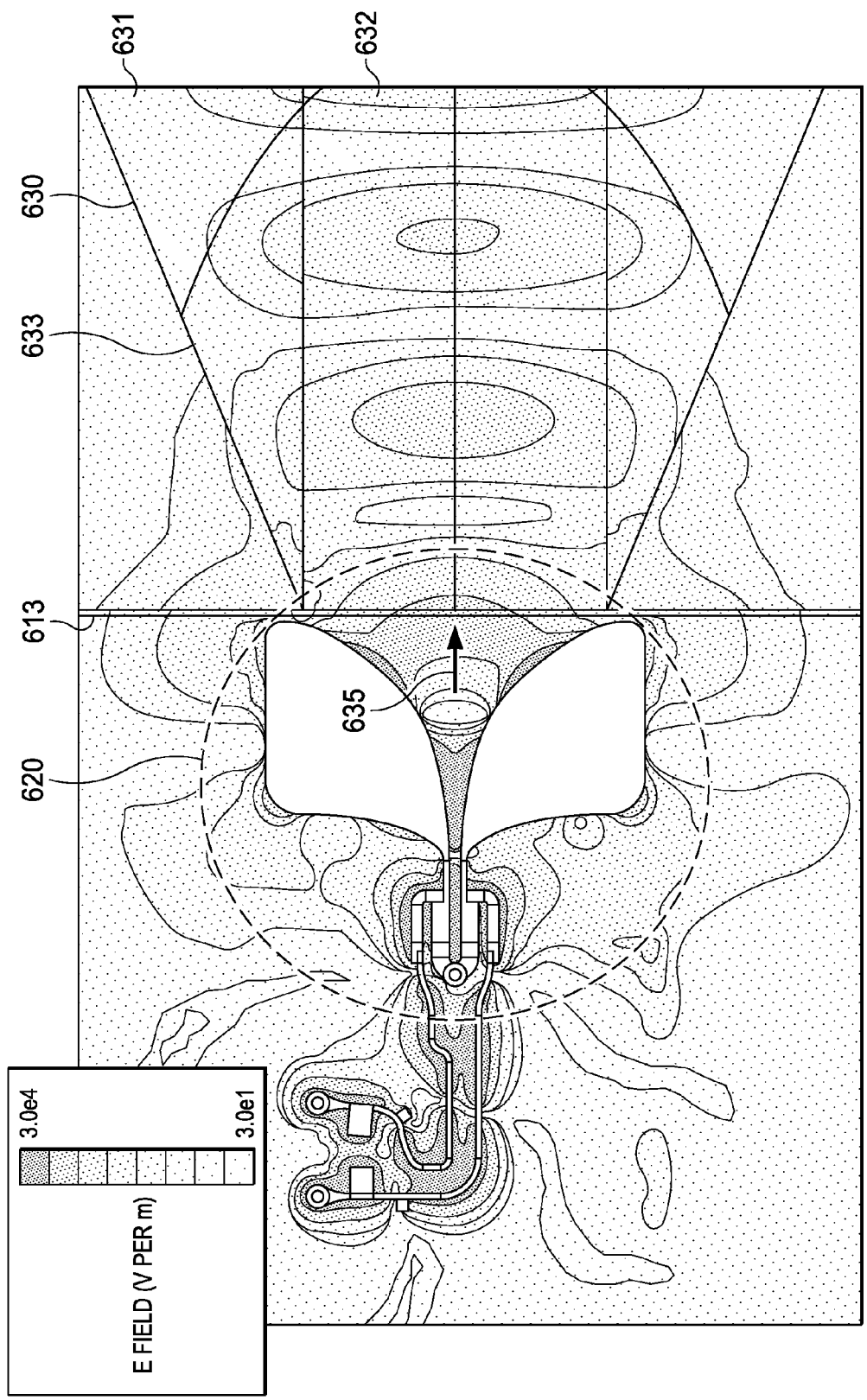

FIGS. 6 and 7 are simulation plots of a signal launched from antenna 620 into an inclined DWG 630, which is similar to DWG 330 of FIG. 4. FIG. 6 provides a side view, and FIG. 7 provides a top view illustrating field strength of a signal launched by antenna 620. The field strength of the individual waves of energy is indicated by the shaded regions in FIGS. 6 and 7. A simulator known as "High Frequency Simulator Structure" (HFSS), (available from ANSYS, Inc) was used to analyze the antennas discussed herein. HFSS is a high performance full wave electromagnetic (EM) field simulator for arbitrary 3D volumetric passive device modeling. It integrates simulation, visualization, solid modeling, and automation using a finite element method (FEM) and an integral equation method. HFSS can extract scattering matrix parameters (S, Y, Z parameters), visualize 3-D electromagnetic fields (near and far-field), and generate Full-Wave SPICE (Simulation Program with Integrated Circuit Emphasis) models that link to circuit simulations.

DWG 630 has a dielectric core 632 and a dielectric cladding 631, as described above with reference to DWG 330. DWG cladding 631 is formed with a low dielectric constant ($\in$k2) material and core 632 is formed with a higher dielectric constant ($\in$k1) material. The end of DWG 630 is tapered, as indicated at 633. The tapered region is polished. In this simulation, a conductive ground plane 650 extends under the entire extent of DWG 630. However, only a reflector plate that has a length such as 351 that extends past the tapered region 633 is needed to direct the signal into inclined DWG 630. Antenna 620 is located adjacent interface edge 613 that defines the edge of the substrate that holds antenna 620.

As can be seen in FIGS. 6 and 7, as long as reflector plate 350 has a length L 351 that exceeds approximately five wavelengths of the signal being launched by antenna 620, then the signal is captured by inclined DWG 630 and propagates down the core 632 of DWG 630, as indicated by vector 635.

Figure 8:
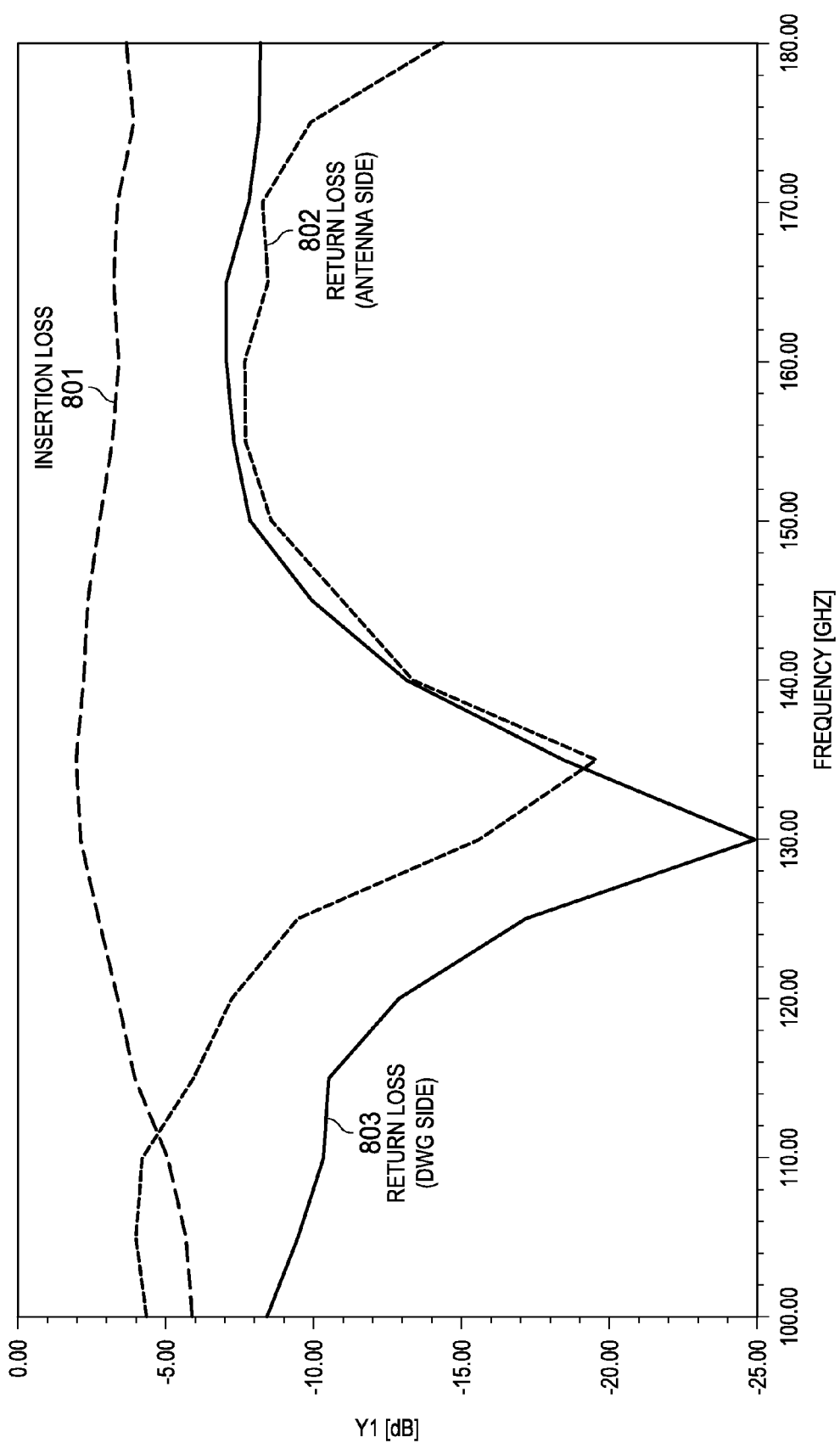
Figure 9:
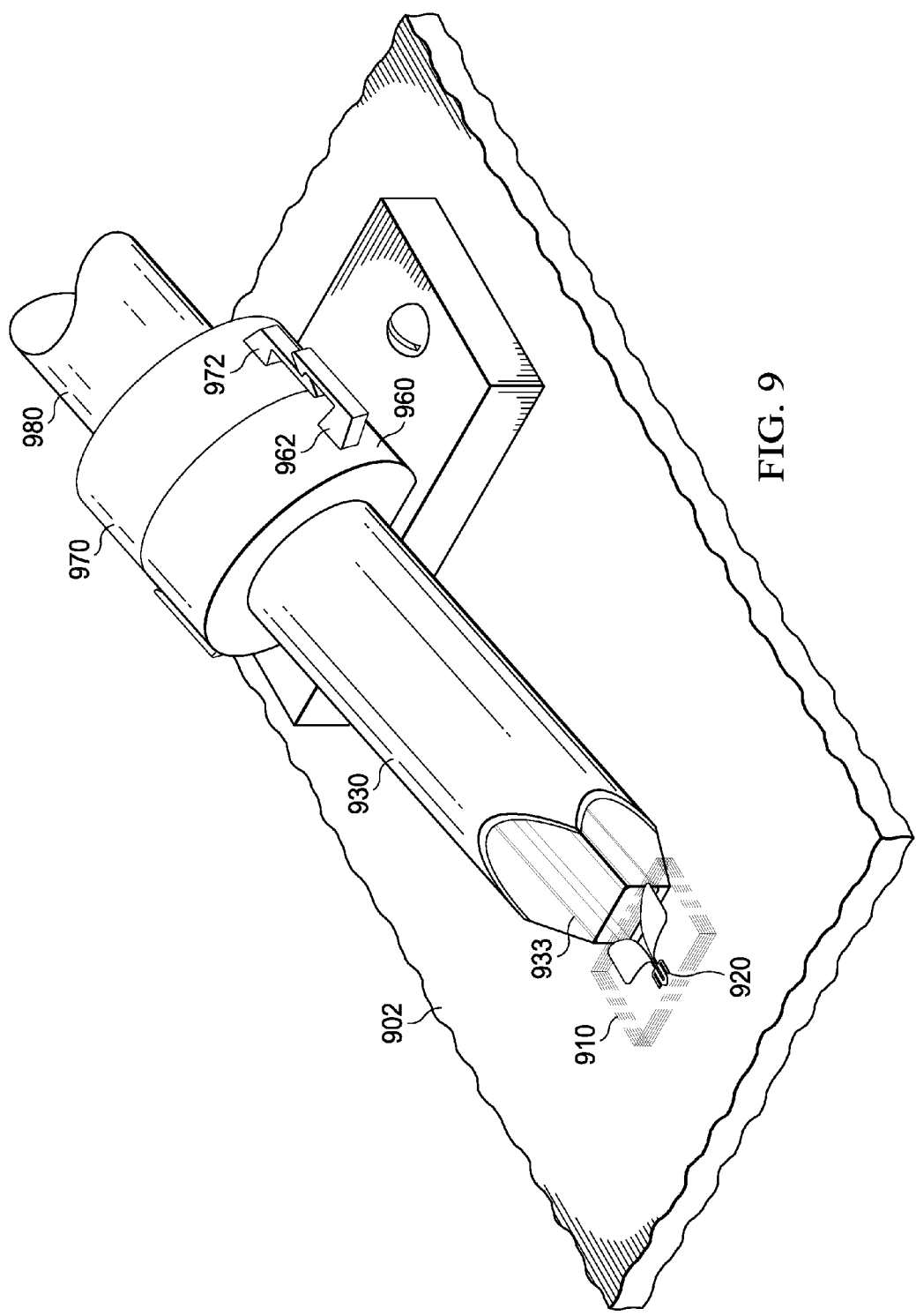
Figure 10:
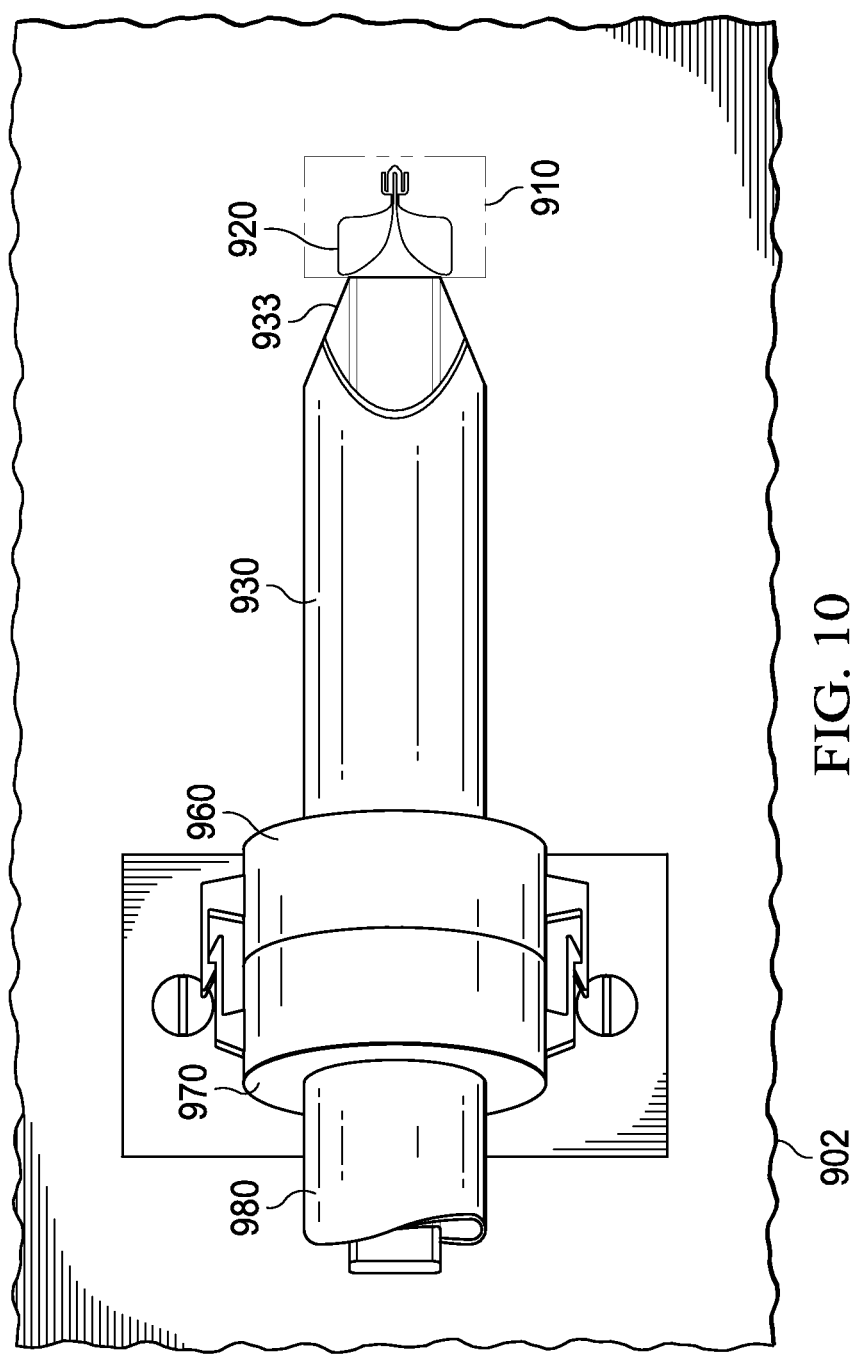

FIG. 8 is a plot illustrating insertion loss 801, return loss on the antenna side 802 and return loss on the DWG side 803 in dB across a frequency range of 100-180 GHz. As can be seen, Vivaldi antenna 320/520 produces a low insertion loss when mated with DWG 330/530 as described herein. The return loss peaks in the frequency region of 130-135 GHz, indicating antenna 320/620 is tuned for that frequency range.

FIGS. 9-13 are illustrations of a DWG socket 960 and matching plug 970 that allow easy coupling of flexible DWG cable 980 to DWG stub 930. DWG stub 930 may be interfaced to a module that includes substrate 910 with antenna 920 located adjacent an interface edge of substrate 910. Substrate 910 may be a multilayered substrate on which is mounted one or more ICs. One of the ICs may have high frequency circuitry to generate or receive sub-terahertz signals when coupled to antenna 920, as described above in more detail.

Socket body 960 is coupled to the DWG stub 930 in such a manner that a mounting surface of the socket body is configured to mount the socket body on a substrate such that the core member of DWG stub forms an angle of inclination with the substrate. As discussed above, the angle of inclination may be in the range of 10-30 degrees, for example. The socket body is configured to couple with the end of DWG cable 980, such that the end of the DWG cable is held in alignment with the mating end of the DWG stub. An exposed face of the core member at the interface end of the DWG stub is oriented perpendicular to the mounting surface of the socket.

Substrate 910 and DWG socket 960 may be mounted on another substrate 902, in a similar manner as described above with reference to FIG. 4. Substrate 902 may be a multilayer PCB, or other type of single or multilayer substrate, as described above in more detail.

As described above, stub 930 may have a tapered region 933. Tapered region 933 may be polished to improve coupling between stub 930 and antenna 920. As discussed above, the tapered region may be tapered in various manners, such as: multiple facets, a conical shape, etc.

FIG. 12 illustrates plug 970 removed from socket 960. Latching fingers 962 and 972 may engage when plug 970 is inserted into socket 960 in order to retain plug 970. This interface may be used to connect a waveguide to extend the length of stub 930, for example, in order to connect two different waveguides in the case where one of them may be part of an electronic device such as: a computer, server, smart-phone, tablet or any other communication device, etc. For example, a DWG segment that is part of an IC module may be coupled to another DWG segment.

While a retainer comprising two latching fingers 962 is illustrated in FIG. 12, in another embodiment, the retainer may have only a single finger, or several fingers, for example. In another embodiment, the retainer may be in the form of a circular snap ring, for example. In another embodiment, socket body 960 may be configured to receive an RJ45 plug, for example.

FIG. 13 illustrates an internal aspect of DWG socket 960 and plug 970 that form a snap connector. In this example, DWGs 930, 980 are coupled with a Silicone gap filler material 1365. One piece 970 of the snap connector is mounted on an end of DWG 980 to form a plug. Another piece 960 of the snap connector is mounted on an end of stub DWG 930. The mounting positions of the snap connector pieces are controlled so that when mated, the deformable gap filler material 1365 is compressed so as to eliminate most, if not all, air from the gap between DWG 930 and DWG 980.

As described in more detail in US 2014-0240187, when two dielectric waveguides are coupled together, there is likely to be a gap between the two DWGs. This gap creates an impedance mismatch that may generate significant losses due to radiated energy produced by the impedance mismatch. The extent of the losses depends on the geometry of the gap and the material in the gap. Based on simulations, a square cut butt joint appears to provide a significant impedance mismatch.

Simulations demonstrate that a spearhead shape such as illustrated at 1364 is effective if the taper is done in only two of the sides of the DWG but it is better when the taper is done in the four sides of the DWG to form a pyramidal shape. This taper could also be replaced by a conical shape on four sides or a vaulted shape on two sides, or any other shape that deflects energy back to the DWG from the signal deflected by the opposite side cut.

A spearhead, pyramidal, conical, vaulted or similar type shape provides an interface with a very low insertion loss, is easy to implement, is mechanically self-aligning, and is flexible and robust to small misalignments. These shapes may all be produced using standard manufacturing materials and fabrication techniques.

Material in the Gap

In the examples discussed above, the material filling the gap may be just air, which has a dielectric constant of approximately 1.0. As discussed earlier, the dielectric constant of the core material will typically be in the range of 3-12, while the dielectric constant of the cladding material will typically be in the range of 2.5-4.5. The mismatch impedance is proportional to the difference of the dielectric constant between the DWG and the material inside the gap. This means that even with the geometry of the socket optimized, an air gap between the DWGs is not an optimum configuration. In order to minimize the impedance mismatch, a DWG socket may be designed with a rubbery material 1365 that has a dielectric constant very close to the dielectric constant of the DWG core and cladding. A flexible material is desirable to accommodate and fill all the space in the gap. An example of a rubbery material with dielectric constant 2.5 to 3.5 is Silicone. Other materials with similar characteristics that may be used fall into two types: unsaturated rubber and saturated rubber.

Unsaturated rubbers include: Synthetic polyisoprene, Polybutadiene, Chloroprene rubber, Butyl rubber, Halogenated butyl rubbers, Styrene-butadiene Rubber, Nitrile rubber, Hydrogenated Nitrile Rubbers, etc, for example.

Saturated rubbers include: EPM (ethylene propylene rubber), EPDM rubber (ethylene propylene diene rubber), Epichlorohydrin rubber (ECO) Polyacrylic rubber (ACM, ABR), Silicone rubber (SI, Q, VMQ), Fluorosilicone Rubber (FVMQ, Fluoroelastomers (FKM, and FEPM) Viton, Tecnoflon, Fluorel, Perfluoroelastomers (FFKM) Tecnoflon PFR, Kalrez, Chemraz, Perlast, Polyether block amides (PEBA), Chlorosulfonated polyethylene (CSM), (Hypalon), Ethylene-vinyl acetate (EVA), etc, for example.

While a particular configuration of a connecter is illustrated in FIG. 13, other embodiments may use any number of now known or later designed connector designs to couple together two DWGs while maintaining mechanical alignment and providing enough coupling force to maintain a deforming pressure on the gap filler material.

Typically, the deformable material may be affixed to either the male end of DWG 980 or to the female end of DWG 930, for example. The deformable material may be affixed in a permanent manner using glue, heat fusion, or other bonding technology. However, a thinner layer of deformable material may be affixed to the end of both DWG 930 and to the end of DWG 980 such that the gap is filled with two layers of deformable material. The male/female orientation of may be reversed in another embodiment.

Referring back to FIG. 12, socket 960 and stub DWG 930 may be manufactured using a 3D printing technique to produce a monolithic structure that may then be mounted onto substrate 902. Alternatively, a 3D printing technique may be used to form DWG socket 960 along with stub DWG 930 directly on substrate 902. The shape of socket 960 may be changed to make such a fabrication easier. For example, the area below the cladding of stub DWG may be filled in with the material that forms the cladding or socket 960.

Figure 14:
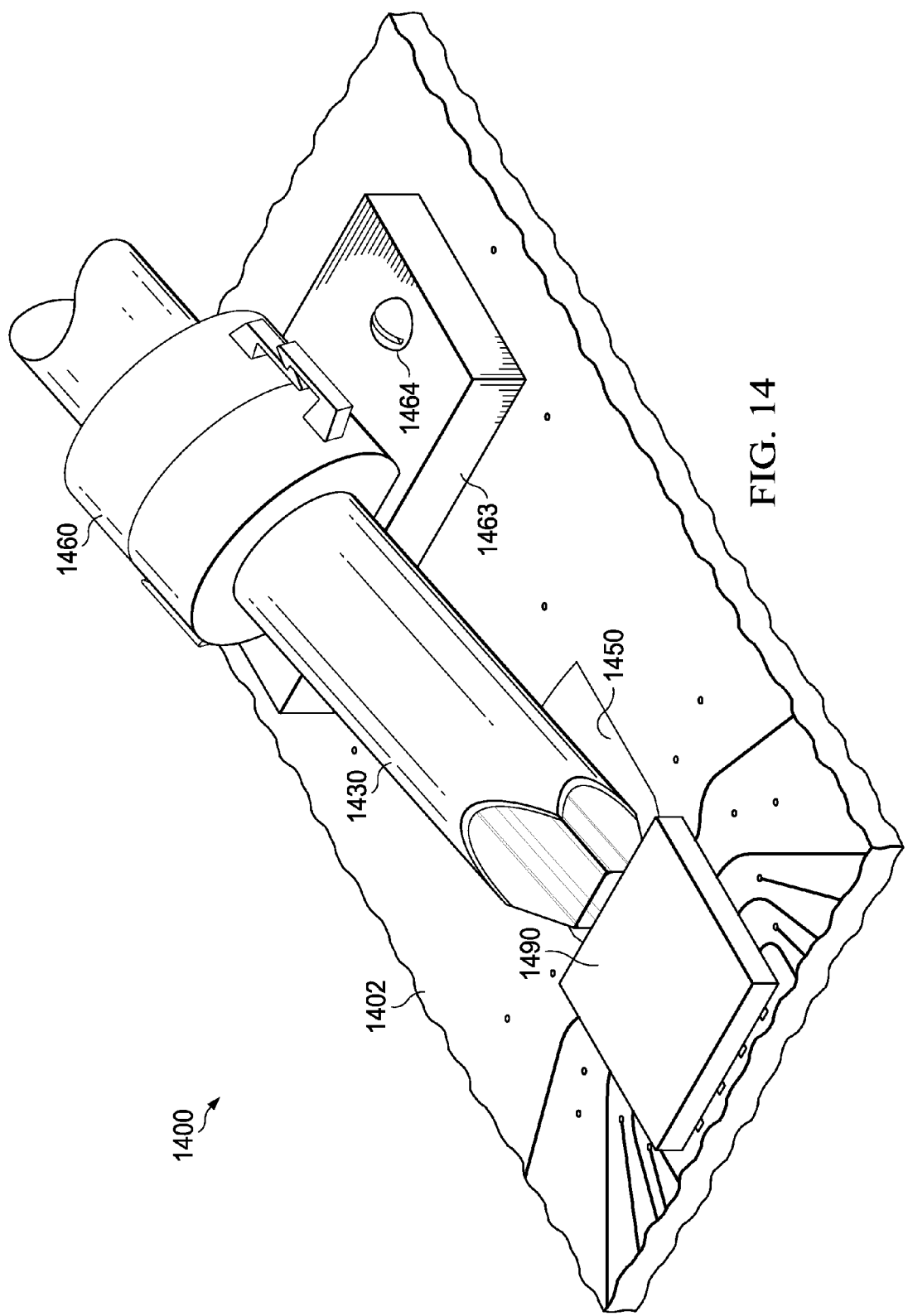
FIG. 14 is an illustration of a system with a DWG socket.

FIG. 14 is an illustration of a system 1400 that may include a system module 1490 that includes high frequency circuitry and an antenna for launching signals into a DWG as described above in more detail. DWG socket 1460 is mounted on substrate 1402 which is a multilayer PCB. DWG socket 1460 includes a mounting base 1463 that may be attached to substrate 1402 using screws and nuts, as indicated at 1464. In this example, reflector plate 1450 is provided on substrate 1402. In this example, reflector plate 1450 is wide enough to accommodate a DWG socket that is aligned with a transmitting antenna within module 1490 or with a receiving antenna within module 1490. In some embodiments, both a transmitting antenna and a receiving antenna may be present, and two DWG stubs may be included in a duplex DWG socket.

In other embodiments, a DWG socket may be mounted to a substrate by other means, such as by gluing, by means of one or more fingers that extend from the DWG socket into a hole in the substrate, by solder bumps on the substrate that couple to a metallic pad on the bottom of the DWG socket, etc.

FIG. 15 is an example substrate 1510 with a Vivaldi antenna 1520. Substrate 1510 is similar to substrate 310, referring to FIG. 3; similarly, Vivaldi antenna 1520 is similar to antenna 320. Substrate 1510 is a multilayer substrate that is configured to support a transmitter using antenna 1520 and optionally a receiver, using an optional Vivaldi antenna that may be placed in the open region labeled 1519. Either or both the transmitter antenna 1520 and a receiver antenna may be fabricated on a top conductive layer of substrate 1510 as a final production step, for example.

Isolation conductive plates 1511a and 1511b are similar to isolation plate 311 and are located on an internal layer of substrate 1510. Similarly, ground plates 1512a and 1512b are similar to ground plate 312 and may be provided on an internal layer of substrate 1510.

The area indicated by 1515 includes routing layers and feed through vias to which an integrated circuit containing high frequency transmitter circuitry may be coupled to antenna 1520. Similarly, the area indicated by 1516 includes routing layers and feed through vias to which an integrated circuit containing high frequency receiver circuitry may be coupled to a receiving antenna in region 1519. The area indicated by 1517 includes routing layers and feed through vias to which an integrated circuit containing various system functions used to generate a data stream for transmission by the transmitter circuit and/or to receive a data stream received by the receiver circuit, for example.

After the top conductive layer has been patterned to form the transmitter antenna 1520 and/or the receiver antenna, the ICs may be attached using known or later developed technology, such as solder bumps. The entire module may then be encapsulated to form a system module for launching signals into a DWG.

Figure 16:
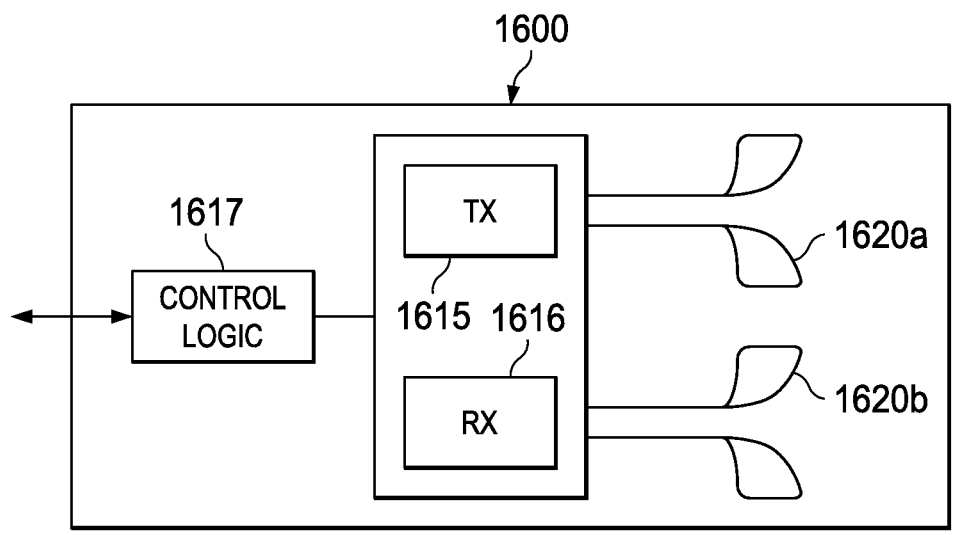
FIG. 16 is a block diagram illustrating a system with signal launching structures.

FIG. 16 is a block diagram illustrating a system module 1600 with signal launching structures 1620a and 1620b. High frequency transmitter circuitry 1615 is coupled to transmitting antenna 1620a. High frequency receiver circuitry 1616 is coupled to receiving antenna 1620b. Transmitter circuitry 1615 and receiver circuitry 1616 may be designed to operate in the sub-terahertz region, such as 100-180 GHz, for example, as described above in more detail.

Control logic 1617 may provide data processing and signal processing in order to produce a data stream for transmission by transmitter circuitry 1615 using known or later developed data processing techniques. Similarly, control logic 1617 may provide data processing and signal processing in order to recover a data stream received by receiver circuitry 1616 using known or later developed data processing techniques, for example.

Device 1600 may be fabricated on a substrate by mounting one or more ICs or bare die on the substrate. Alternatively, device 1600 may be fabricated on a single integrated circuit (IC) using known or later developed semiconductor processing techniques. Various processors, memory circuits, and peripheral circuits may also be fabricated on the IC to form a complex system on chip (SoC) IC, for example.

Figure 17:
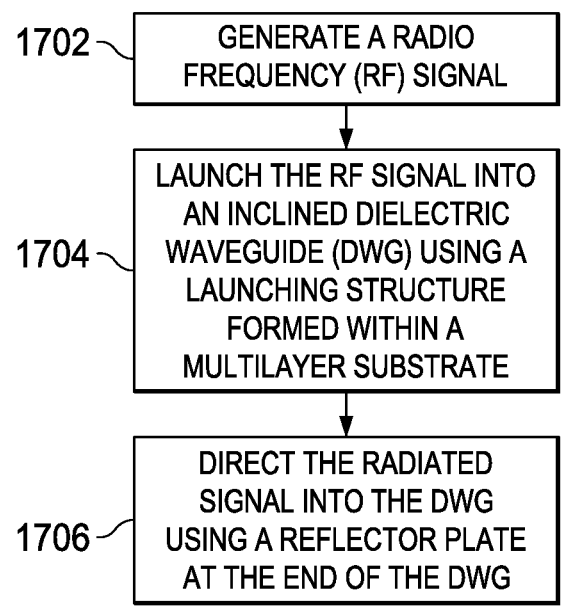
FIG. 17 is a flow chart illustrating launching of a signal into an inclined DWG.

FIG. 17 is a flow chart illustrating launching of a signal into an inclined DWG. A sub-terahertz radio frequency signal may be generated 1702 by a transmitter circuit mounted on a first multilayer substrate. As described above in more detail, a typical range of RF signals used by a DWG interconnect may be in the range of 110-180 GHz, for example.

The RF signal is launched 1704 into an inclined DWG using a launching structure located on the first multilayer substrate. As described above in more detail, the launching structure may be a directional Vivaldi antenna, for example, that is located adjacent an interface edge of the first substrate. The antenna may be coupled to the transmitter circuit using a balance differential feed line, as illustrated in FIG. 3, for example.

The first substrate and the inclined DWG may be mounted on a second substrate such that an exposed surface of the DWG core at the end of the DWG is adjacent the interface edge of the first substrate with the core of the DWG approximately centered on the antenna. A reflector plate, such as reflector plate 350, 1450 may be provided on the second substrate under the end of the DWG to direct 1706 the radiated signal into the DWG, as described above in more detail with regards to FIGS. 4-8, for example.

In a similar manner, a signal may be received on an inclined DWG and directed into an antenna structure using a reflector plate mounted on the second substrate, as described above in more detail.

As discussed in more detail above, the launching structures may be a directional Vivaldi antenna. In other embodiments, the launching structure may be a horizontal or vertical dipole, horizontal or vertical patches, or other known or later developed structures that are capable of launching an RF signal into a DWG.

The various dielectric core waveguide and socket configurations described above may be fabricated using a printing process, such as an inkjet printer or other three dimensional printing mechanism. Fabrication of three dimensional structures using ink jet printers or similar printers that can "print" various polymer materials is well known and need not be described in further detail herein. Fabrication of DWGs using 3D printing is described in more detail in U.S. patent application Ser. No. 14/498,837. Printing allows for the rapid and low-cost deposition of thick dielectric and metallic layers, such as 0.1 um-1000 um thick, for example, while also allowing for fine feature sizes, such as 20 um feature sizes, for example. Standard integrated circuit (IC) fabrication processes are not able to process layers this thick. Standard macroscopic techniques, such as machining and etching, typically used to manufacture dielectric waveguides and metallic structures may only allow feature sizes down to 1 mm, for example. These thicker printed dielectric and metallic layers on the order of 100 nm-1 mm which are made possible by inkjet printing enable waveguide operation at Sub-THz and THz frequencies. Previously optical frequencies could be handled using standard semiconductor fabrication methods while lower frequencies may be handled using large metallic waveguides; however, there was a gap in technology for fabricating waveguides for THz signals. Printing the waveguide and socket directly onto the chip/package/board mitigates alignment errors of standard waveguide assemblies and simplifies the packaging process.

Other Embodiments

While the invention has been described with reference to illustrative embodiments, this description is not intended to be construed in a limiting sense. Various other embodiments of the invention will be apparent to persons skilled in the art upon reference to this description. For example, while a Vivaldi antenna was described herein, various configurations of dipole and patch antennas, or other known or later developed launching structures may be used to excite transmission into an inclined DWG.

While a dielectric waveguide has been described herein, another embodiment may use a metallic or non-metallic conductive material to form the top, bottom, and sidewalls of the wave guide, such as: a conductive polymer formed by ionic doping, carbon and graphite based compounds, conductive oxides, etc., for example.

A DWG stub and socket assembly may be fabricated onto a surface of a substrate using an inkjet printing process or other 3D printing process, for example.

While waveguides with polymer dielectric cores have been described herein, other embodiments may use other materials for the dielectric core, such as ceramics, glass, etc., for example.

While dielectric cores with a rectangular cross section are described herein, other embodiments may be easily implemented using the printing processes described herein. For example, the dielectric core may have a cross section that is rectangular, square, trapezoidal, cylindrical, oval, or many other selected geometries. Furthermore, the cross section of a dielectric core may change along the length of a waveguide in order to adjust impedance, produce transmission mode reshaping, etc., for example.

The dielectric core of the conductive waveguide may be selected from a range of approximately 2.4-12, for example. These values are for commonly available dielectric materials. Dielectric materials having higher or lower values may be used when they become available.

While sub-terahertz signals in the range of 100-180 GHz were discussed herein, sockets and systems for launching higher or lower frequency signals may be implemented using the principles described herein by adjusting the physical size of the DWG core accordingly.

Certain terms are used throughout the description and the claims to refer to particular system components. As one skilled in the art will appreciate, components in digital systems may be referred to by different names and/or may be combined in ways not shown herein without departing from the described functionality. This document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Although method steps may be presented and described herein in a sequential fashion, one or more of the steps shown and described may be omitted, repeated, performed concurrently, and/or performed in a different order than the order shown in the figures and/or described herein. Accordingly, embodiments of the invention should not be considered limited to the specific ordering of steps shown in the figures and/or described herein.

It is therefore contemplated that the appended claims will cover any such modifications of the embodiments as fall within the true scope and spirit of the invention.

What is claimed is:

1. A signal transmitting system comprising:
   a first substrate having a first surface and an opposite second surface;
   a second multilayer substrate having a first surface and an opposite second surface, with an edge surface arranged approximately perpendicular between the first surface and the second surface;
   a transmitter circuit located on the second multilayer substrate, the transmitter having a radio frequency (RF) output port, in which the transmitter is configured to generate an RF signal having a wavelength;
   an antenna formed on or within the second multilayer substrate and adjacent to the edge surface and coupled to the output port of the first transmitter;
   in which the second multilayer substrate is mounted on the first surface of the first substrate; and
   a conductive reflector plate formed on or within the first substrate, such that the conductive reflector plate extends from approximately the edge of the first multilayer substrate adjacent the antenna for a distance greater than approximately five wavelengths of the RF signal away from the edge of the first multilayer substrate.

2. The system of claim 1, further including:
   a dielectric waveguide (DWG) having a dielectric core member surrounded by dielectric cladding, in which an end of the DWG is mounted above the reflector plate such that an exposed face of the core member at the end of the DWG is adjacent the antenna, and such that the core member at the end of DWG forms an angle of inclination with the first substrate in which the angle is in a range of approximately 10-30 degrees.

3. The system of claim 2, in which the dielectric cladding at the end of the DWG is tapered to approximately match the angle of inclination of the core at the end of the DWG.

4. The system of claim 3, in which the tapered portion of the cladding is polished.

5. The system of claim 1, in which the antenna is a Vivaldi antenna.

6. The system of claim 1, further including a dielectric waveguide (DWG) socket mounted on the first substrate, in which the DWG socket includes:
   a dielectric waveguide (DWG) stub having a dielectric core member surrounded by dielectric cladding, the DWG stub having an interface end and an opposite mating end;
   a socket body coupled to the DWG stub, such that a mounting surface of the socket body is configured to mount the socket body on the first substrate such that the core member of DWG stub forms an angle of inclination with the first substrate; and
   in which the socket body is configured to couple with the end of a DWG cable, such that the end of the DWG cable is held in alignment with the mating end of the DWG stub.

7. The system of claim 6, in which a portion of the dielectric cladding at the interface end of the DWG stub is tapered to approximately match the angle of inclination of the core of the DWG stub.

8. The system of claim 6, further including a retainer coupled to the socket body configured to retain the end of the DWG cable when the end of the DWG cable is inserted in the socket body.

9. The system of claim 6, in which the socket body and the cladding of the stub are monolithic.

10. The system of claim 6, in which the mating end of the DWG stub is configured in a non-planer shape for mating with a DWG cable having a matching non-planar shaped mating end.

11. The system of claim 10, wherein the non-planar shape is a spearhead shape.

12. The system of claim 10, further comprising a deformable material disposed on the surface of the mating end of the DWG stub, such that when mated to the DWG cable, the deformable material fills a gap region between the mating ends of the DWG stub and the DWG cable.

13. The DWG socket of claim 11, wherein the deformable material has a dielectric constant value that is selected from a range between approximately the dielectric constant value of the cladding and the dielectric constant value of the core member of the DWG stub.

14. The DWG socket of claim 11, wherein the deformable material has a core region with a dielectric constant value approximately equal to the dielectric constant value of the core member of the DWG stub, and the deformable material has a cladding region with a dielectric constant value approximately equal to the dielectric constant value of the cladding of the DWG stub.

\* \* \* \* \*